United States Patent
Ding et al.

[11] Patent Number: 6,048,768
[45] Date of Patent: Apr. 11, 2000

[54] METHOD OF MANUFACTURING FLASH MEMORY

[75] Inventors: Yen-Lin Ding, Hsinchu; Gary Hong, Hsin-Chu, both of Taiwan

[73] Assignee: United Semiconductor Copr., Hsinchu, Taiwan

[21] Appl. No.: 09/267,760

[22] Filed: Mar. 11, 1999

[30] Foreign Application Priority Data

Dec. 24, 1998 [TW] Taiwan .................................. 87121609

[51] Int. Cl.[7] .................................................. H01L 21/336
[52] U.S. Cl. ........................ 438/264; 438/257; 438/594
[58] Field of Search .................................. 438/264, 263, 438/257, 258, 259, 265, 593, 594, 300, FOR 203, FOR 212, 266; 148/DIG. 109

[56] References Cited

U.S. PATENT DOCUMENTS

| | | | |
|---|---|---|---|
| 5,352,619 | 10/1994 | Hong | 438/263 |
| 5,696,019 | 12/1997 | Chang | 438/221 |
| 5,780,341 | 7/1998 | Ogura | 438/259 |
| 5,851,881 | 12/1998 | Lin et al. | 438/266 |
| 5,972,752 | 10/1999 | Hong | 438/264 |

*Primary Examiner*—Michael Trinh
*Attorney, Agent, or Firm*—J.C. Patents Jiawei Huang

[57] ABSTRACT

A method for manufacturing a flash memory. A substrate having a patterned pad oxide layer formed thereon and a patterned mask layer on the pad oxide layer is provided. A doped region is formed in the substrate exposed by the patterned mask layer and the pad oxide layer. A spacer is formed on the sidewall of the patterned mask layer and the pad oxide layer to cover a portion of the doped region. A trench is formed in the substrate exposed by the mask layer and the spacer. An insulating layer is formed to fill the trench, wherein the insulating layer leveled with a top surface of the patterned mask layer. The patterned mask layer and the spacer are removed to respectively expose the patterned oxide layer and the portion of the doped region. A self-aligned tunnel oxide layer is formed on the portion of the doped region. A patterned first conductive layer is formed over the substrate to expose portions of the patterned pad oxide layer above the substrate excluding the doped region. A self-aligned doped region is formed in the substrate under the patterned pad oxide layer exposed by the patterned first conductive layer. A dielectric layer is formed on the patterned first conductive layer and the self-aligned doped region. A patterned second conductive layer is formed over the substrate.

16 Claims, 4 Drawing Sheets

METHOD OF MANUFACTURING FLASH MEMORY

CROSS-REFERENCE TO RELATED APPLICATION

This application claims the priority benefit of Taiwan application serial no. 87121609, filed Dec. 24, 1998, the full disclosure of which is incorporated herein by reference.

BACKGROUND OF THE INVENTION

1. Field of the Invention

The present invention relates to a method of manufacturing a semiconductor device. More particularly, the present invention relates to a method of manufacturing a flash memory.

2. Description of the Related Art

A conventional flash memory is a type of erasable programmable read-only memory (EPROM), which in turn is a type of non-volatile memory. In general, an EPROM cell comprises two gates. One of the gates, known as a floating gate, is fabricated from polysilicon and is used for charge storage. The second gate, known as the control gate, is used for controlling the input and output of data. The above floating gate is located beneath the control gate, and is generally in a floating state because there is no connection with external circuits. The control gate is normally wired to the word line. One of the advantages of flash memory is its capacity for block-by-block memory erasure. Furthermore, the speed of memory erase is fast, and normally takes just 1 to 2 seconds for the complete removal of a whole block of memory. For most other EPROM, memory erasure can take up to several minutes due to its bit-by-bit operation.

In typical integrated circuits (ICs), two adjacent devices should be isolated from each other by an insulating structure such as a filed oxide layer or a shallow trench isolation (STI). The STI is better than the field oxide layer and the size of the devices can be decreased by using the STI, so the STI is more popular than the field oxide layer in IC industry. Currently, the STI is formed by first anisotropically etching to form a trench in the substrate, and then depositing an oxide layer in the trench and over the substrate. Next, a chemical-mechanical polishing step is used to planarize the oxide layer to finish the process of manufacturing the STI.

However, the flash memory with the STI structures has the problem of misalignment while the STI of the flash memory is formed. The misalignment leads to unanticipated electrical coupling and relatively low reliability of the devices. Additionally, the size of the devices is limited by the design rule, so it is difficult to reduce the size of the devices.

SUMMARY OF THE INVENTION

It is therefore an objective of the invention to provide a method of manufacturing a flash memory. In the flash memory according to the invention, the tunnel oxide layer and the source region are formed by the method of self-alignment, so the limitation of design rule to the formation of a flash memory and the size of the devices are minimized.

To achieve these and other advantages and in accordance with the purpose of the invention, as embodied and broadly described herein, the invention provides a method of manufacturing a flash memory. A substrate having a patterned pad oxide layer formed thereon and a patterned mask layer on the pad oxide layer is provided. A doped region is formed in the substrate exposed by the patterned mask layer and the pad oxide layer. A spacer is formed on the sidewall of the patterned mask layer and the pad oxide layer to cover a portion of the doped region. A trench is formed in the substrate exposed by the mask layer and the spacer. An insulating layer is formed to fill the trench, wherein the insulating layer leveled with a top surface of the patterned mask layer. The patterned mask layer and the spacer are removed to respectively expose the patterned oxide layer and the portion of the doped region. A self-aligned tunnel oxide layer is formed on the portion of the doped region. A patterned first conductive layer is formed over the substrate to expose portions of the patterned pad oxide layer above the substrate excluding the doped region. A self-aligned doped region is formed in the substrate under the patterned pad oxide layer exposed by the patterned first conductive layer. A dielectric layer is formed on the patterned first conductive layer and the self-aligned doped region. A patterned second conductive layer is formed over the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
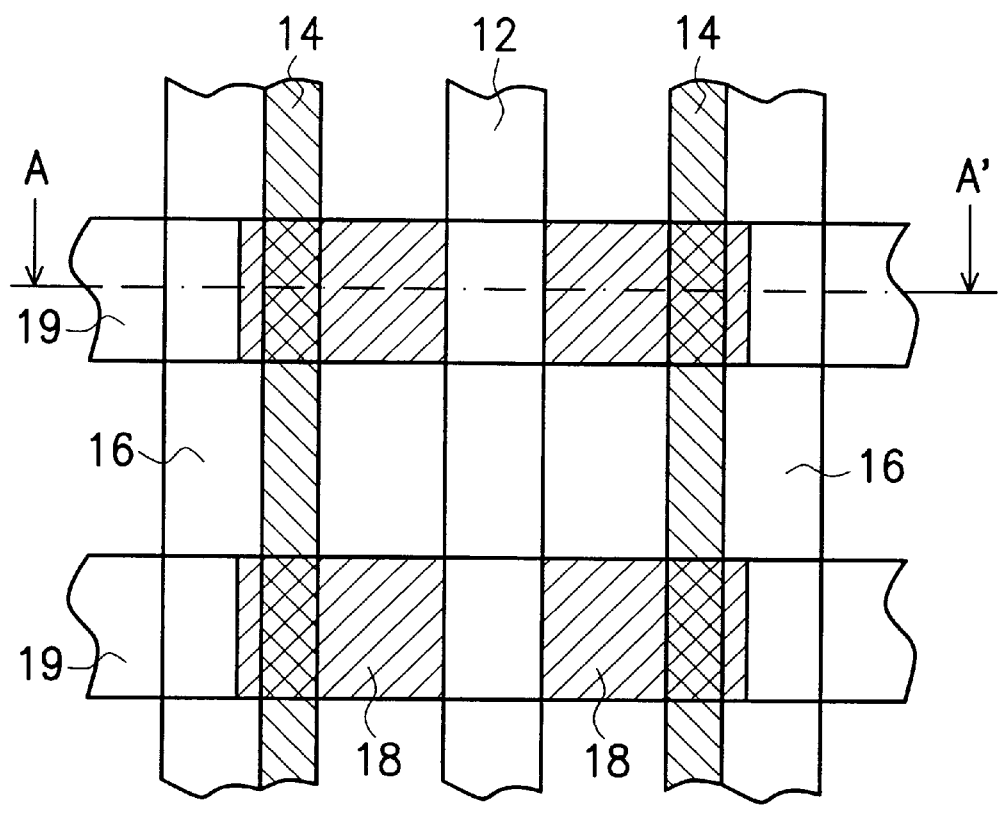
FIG. 1 is schematic, top view of a flash memory in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is schematic, top view of a flash memory in a preferred embodiment according to the invention.

As shown in FIG. 1, an extending source regions 12 is formed in a substrate 10. Extending drain regions 14 used as bit lines are parallel to the source region 12 and adjacent to the source region 12. One side of each drain region 14 away from the source region 12 has extending isolation structures 16 formed in the substrate 10. The isolation structures 16 can be of an STI type, for example. Extending controlling gates 19 array are in the same plane parallel to the surface of the substrate 10 and vertically crossing the source region 12 and the drain regions 14. The controlling gates 19 are isolated from the substrate 10 by floating gates 18. Between the floating gates 18 and the drain regions 14 is further comprised a tunnel oxide layer (not shown).

FIGS. 2A through 2J are schematic, cross-sectional views taken along the line A-A' in FIG. 1 of the process for manufacturing a flash memory in a preferred embodiment according to the invention.

Figure 2A:
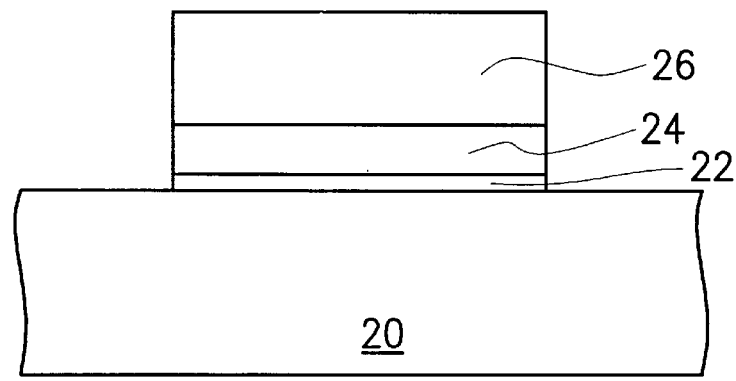
FIGS. 2A through 2J are schematic, cross-sectional views taken along the line A-A' in FIG. 1 of the process for manufacturing a flash memory in a preferred embodiment according to the invention; and Table 1 is the requirements of the conventional operation voltage.

As shown in FIG. 2A, a pad oxide layer 22 is formed on a substrate 20. The thickness of the pad oxide layer 22 is about 100–500 angstroms. A mask layer 24 is formed on the pad oxide layer 22. The mask layer 24 can be a silicon nitride layer formed by chemical vapor deposition (CVD), for example. The thickness of the mask layer is about 1000–3000 angstroms. A patterned photoresist 26 is formed on the mask layer 24. Portions of the mask layer 24 and the pad oxide layer 22 are removed to expose the surface of the substrate 20 by an etching step. The etching step can be an anisotropic etching step.

Figure 2B:
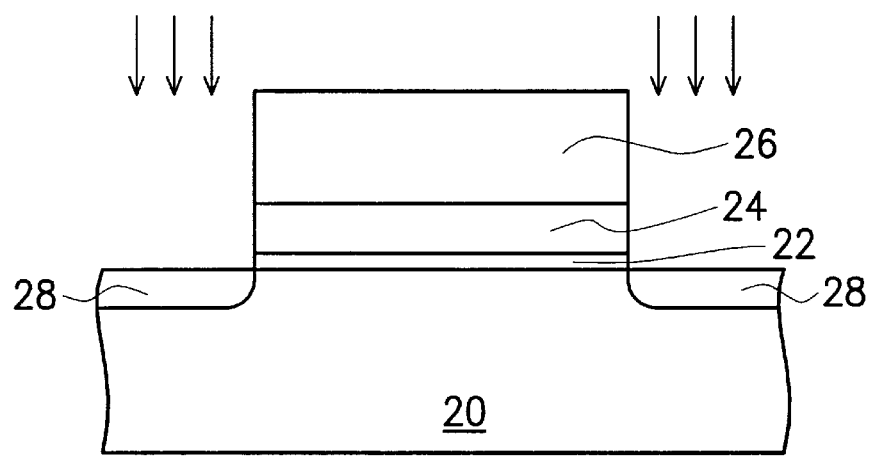

As shown in FIG. 2B, an implantation step is performed to form doped regions 28 adjacent to the pad oxide layer 22 in the substrate exposed by the pad oxide layer, the mask layer 24 and the photoresist 26. The doped regions 28 can be used as drain regions, for example. In the example, the dopants of the doped regions 28 can be arsenic ions or phosphorus ions with an implantation dosage of about $1\times10^{15}/cm^3$.

Figure 2C:
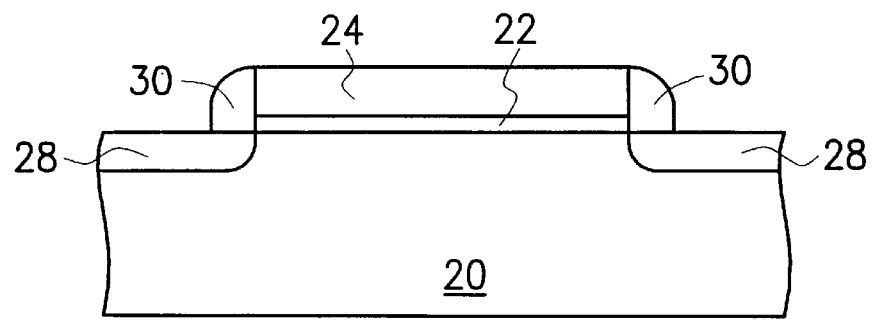

As shown in FIG. 2C, the photoresist 26 is removed to expose the surface of the mask layer 24. Spacers 30 are formed on the sidewalls of the mask layer 24 and the pad oxide layer 22. The spacers 30 can be made of silicon nitride, for example. In this preferred embodiment, the material of the spacers 30 is same as that of the mask layer 24. In this example, the method of forming the spacers 30 comprises the steps of depositing an insulating layer such as a silicon nitride layer over the substrate 20. An etching back step is used to form the spacers 30 on the sidewalls of the mask layer 24 and the pad oxide layer 22.

Figure 2D:
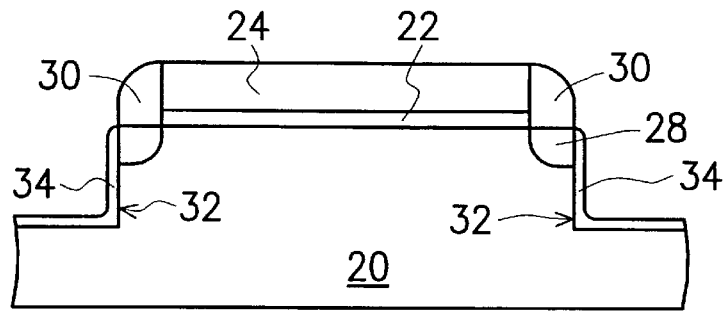

As shown in FIG. 2D, an anisotropic etching step is used to form trenches 32 in the substrate 20 exposed by the mask layer 24 and the spacer 30. Therefore, the width of each spacer 30 is respectively equal to that of each the doped region 28 beneath the spacer 30. The step height of each trench 32 is about 3000–10000 angstroms. A liner oxide layer 34 is formed in the trenches 32 by thermal oxidation.

Figure 2E:
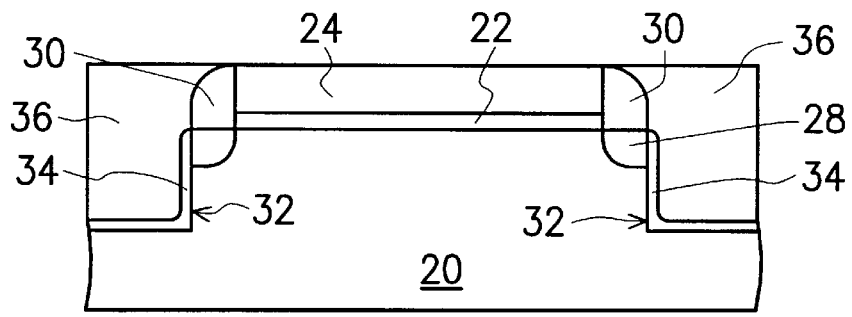

As shown in FIG. 2E, an insulating layer 36 is formed to fill the trenches 32. The insulating layer 36 is leveled with a top surface of the mask layer 24. In this example, the method of forming the insulating layer 36 comprises the steps of forming the insulating layer 36 such as a silicon oxide layer formed by CVD with a tetraethosiloxane gas source over the substrate. Portions of insulating layer 36 are removed to expose the surface of the mask layer 24 by chemical-mechanical polishing (CMP). Therefore, the insulating layer 36 has a substantially same surface level as the top surface of the mask layer 24. Preferably, the material of the insulating layer 36 is different from that of the spacers 30 and mask layer 24.

Figure 2F:
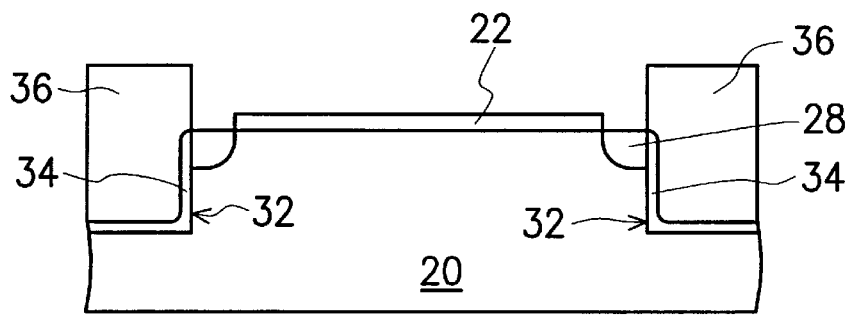

As shown in FIG. 2F, the mask layer 24 and the spacers 30 are removed to respectively expose the doped regions 28 and the pad oxide layer 22. Since the materials of the mask layer 24 and the spacers 30 are the same and are different from that of the insulating layer 36, the mask layer 24 and the spacers 30 can be removed simultaneously. The method of removing the mask layer 24 and the spacers 30 can be wet etching or dry etching, for example.

Figure 2G:
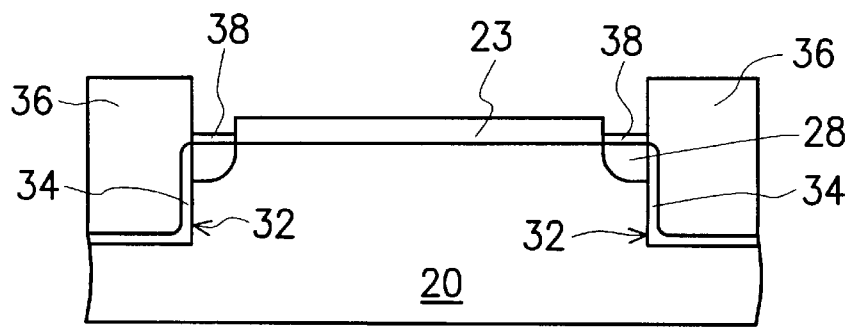

As shown in FIG. 2G, a self-aligned tunnel oxide layer 38 is formed on the doped regions 28. The method of forming the self-aligned tunnel oxide layer 38 includes thermal oxidation. Because the pad oxide layer 22 and the insulating layer 36 cover the substrate 20 excluding the doped regions 28, only the silicon on the surface of the doped regions 28 can react with oxygen to form the self-aligned tunnel oxide layer 38 on the doped regions 28. At the same time, the pad oxide layer 22 grows thicker to form a gate oxide layer 23. The area of the self-aligned tunnel oxide layer 38 is smaller than one formed under a minimized design rule.

Figure 2H:
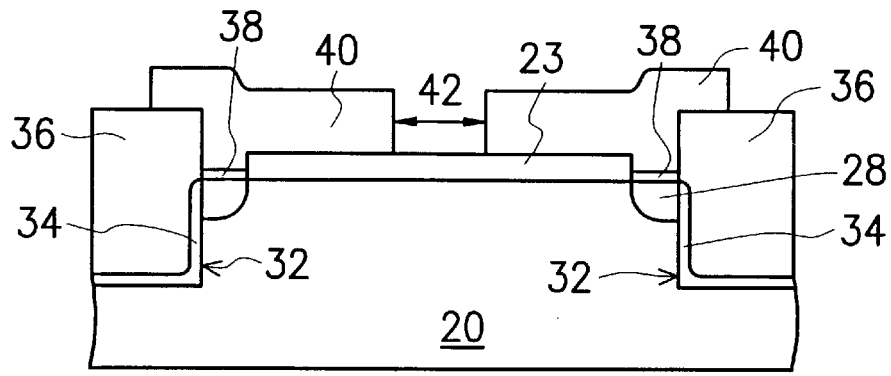

As shown in FIG. 2H, a conductive layer 40 is formed over the substrate 20. The conductive layer 40 can be a doped polysilicon layer, for example. The conductive layer 40 is patterned to form an opening 42 exposing a portion of the gate oxide layer 23 and to expose portions of the insulating layer 36.

Figure 2I:
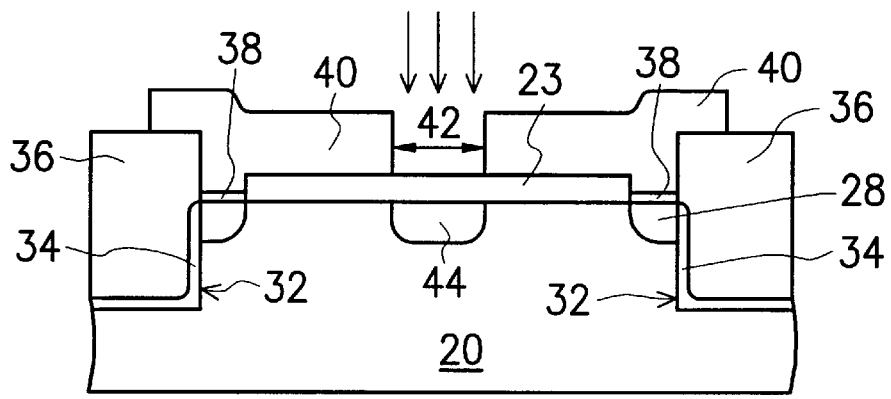

As shown in FIG. 2I, an implantation step is used to from a self-aligned doped region 44 in the substrate 20 under the portion of the gate oxide layer 23 exposed by the opening 42. The self-aligned doped region 44 is used as a source region. In the example, the dopants of the self-aligned doped region 44 can be arsenic ions or phosphorus ions with an implantation dosage of about $1\times10^{15}/cm^3$.

Figure 2J:
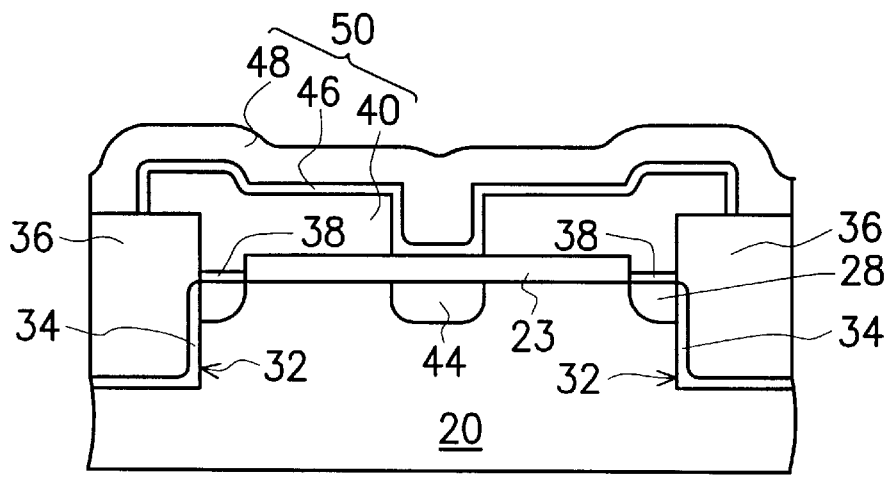

As shown in FIG. 2J, a dielectric layer 46 is conformally formed on the conductive layer 40 and the self-aligned doped region 44. The dielectric layer 46 can be a silicon oxide/silicon nitride/silicon oxide (ONO) layer, for example. A conductive layer 48 is formed on the dielectric layer 46 and the insulating layer 36. The conductive layer 48 can be a doped polysilicon layer, for example. The conductive layer 48 is patterned to form a strip of controlling gate across over the conductive layer 40 and the strip of controlling gate is denoted as the controlling gates in FIG. 1. The conductive layer 40 used as the floating gate, the dielectric layer 46 and the conductive layer 48 used as the controlling gate together form a stacked gate 50.

In the invention, since the tunnel oxide layer and the source/drain region are formed by the method of self-alignment, the limitation of design rule to the formation of a flash memory and the size of the devices are minimized. Although the size of the devices and the self-aligned tunnel oxide layer are reduced, the tunnel efficiency between floating gate and the drain region is very high when the device is programmed and erased by F—N tunneling through the tunnel oxide layer on the drain regions. Hence, the flash memory according to the invention can meet the requirements of the conventional operation voltage (as shown in table 1).

TABLE 1

|  | Word line (gate) | Bit line (drain) | Source |
| --- | --- | --- | --- |
| Program | 0 V | 8 V | OPEN |
| Erase | 12 V | 0 V | OPEN |
| Read | 3 V | 1 V | 0 V |

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a flash memory, comprising the steps of:

providing a substrate having a patterned pad oxide layer formed thereon and a patterned mask layer on the pad oxide layer;

forming a doped region in the substrate exposed by the patterned mask layer and the pad oxide layer;

forming a spacer on a sidewall of the patterned mask layer and the pad oxide layer to cover a portion of the doped region;

forming a trench in the substrate exposed by the mask layer and the spacer;

forming an insulating layer to fill the trench, wherein the insulating layer leveled with a top surface of the patterned mask layer;

removing the patterned mask layer and the spacer to respectively expose the patterned pad oxide layer and the portion of the doped region;

forming a self-aligned tunnel oxide layer on the portion of the doped region and thickening the patterned pad oxide layer to form a gate oxide layer, simultaneously;

forming a patterned first conductive layer over the substrate to expose a portion of the gate oxide layer above the substrate excluding the portion of the doped region;

forming a self-aligned doped region in the substrate under the gate oxide layer exposed by the patterned first conductive layer;

forming a dielectric layer on the patterned first conductive layer and the self-aligned doped region; and forming a patterned second conductive layer over the substrate.

2. The method of claim 1, wherein the mask layer includes a silicon nitride layer.

3. The method of claim 1, wherein the doped region can be a drain region.

4. The method of claim 1, wherein the step of forming the spacer comprises the steps of:

forming an insulating layer on the patterned mask layer and the substrate; and removing portions of the insulating layer to form the spacer on the sidewall of the patterned mask layer and the pad oxide layer.

5. The method of claim 1, wherein the insulating layer includes a silicon oxide layer.

6. The method of claim 1 wherein material of the spacer is the same as that of the mask layer.

7. The method of claim 1, wherein a material of the spacer is different from that of the insulating layer.

8. The method of claim 1, wherein material of the mask layer is different from that of the insulating layer.

9. The method of claim 1, wherein before the step of filling the trench with the insulating layer further comprises a step of forming a liner on the trench surface by thermal oxidation.

10. The method of claim 1, wherein the insulating layer includes a silicon oxide layer formed by chemical vapor deposition with a tetraethosiloxane gas source.

11. The method of claim 1, wherein after the step of forming the insulating layer further comprises a step of performing a chemical-mechanical polishing process.

12. The method of claim 1, wherein the step of forming the self-aligned tunnel oxide layer includes thermal oxidation.

13. The method of claim 1, wherein the patterned first conductive layer includes a doped polysilicon layer.

14. The method of claim 1, wherein the patterned second conductive layer includes a doped polysilicon layer.

15. The method of claim 1, wherein the width of the spacer is equal to that of the doped region.

16. The method of claim 1, wherein the self-aligned doped region is a source region.

* * * * *